(12) United States Patent
Yang et al.

(10) Patent No.: US 8,592,832 B2
(45) Date of Patent: Nov. 26, 2013

(54) ORGANIC LIGHT EMISSION DIODE DISPLAY DEVICE AND METHOD OF FABRICATING THE SAME

(75) Inventors: Tae-Hoon Yang, Yongin (KR); Han-Hee Yoon, Yongin (KR); Kil-Won Lee, Yongin (KR); Jang-Soon Im, Yongin (KR); Ji-Yong Noh, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 242 days.

(21) Appl. No.: 12/635,964

(22) Filed: Dec. 11, 2009

(65) Prior Publication Data

US 2010/0155747 A1   Jun. 24, 2010

(30) Foreign Application Priority Data

Dec. 18, 2008   (KR) ........................ 10-2008-0129326

(51) Int. Cl.
  *H01L 29/18*   (2006.01)
  *H01L 29/10*   (2006.01)

(52) U.S. Cl.
  USPC ................... 257/88; 257/98; 257/40; 257/66; 257/72; 438/29; 438/166; 438/486

(58) Field of Classification Search
  USPC ........ 257/66–70, 72, 88, 98, 40; 438/29, 166, 438/486–487
  See application file for complete search history.

(56) References Cited

U.S. PATENT DOCUMENTS

| 6,727,121 B2 | 4/2004 | Joo et al. |
| 7,728,510 B2 | 6/2010 | Oh |
| 2003/0180991 A1* | 9/2003 | Seo et al. ........................ 438/151 |
| 2008/0157094 A1 | 7/2008 | Seo et al. |
| 2008/0296565 A1* | 12/2008 | Park et al. ........................ 257/40 |
| 2008/0315207 A1* | 12/2008 | Yang et al. ........................ 257/66 |

FOREIGN PATENT DOCUMENTS

| CN | 1812119 | 8/2006 |
| EP | 1858068 | 11/2007 |
| JP | 5-109678 | 4/1993 |
| JP | 7-249773 | 9/1995 |
| JP | 11-052426 | 2/1999 |

(Continued)

OTHER PUBLICATIONS

JP2003-149677 Sano et al. Published May 21, 2003. Machine translation.*

*Primary Examiner* — Asok K Sarkar
*Assistant Examiner* — Dmitriy Yemelyanov
(74) *Attorney, Agent, or Firm* — H.C. Park & Associates, PLC

(57) ABSTRACT

An organic light emission diode (OLED) display device and a method of fabricating the same, wherein the OLED display device includes a substrate including a pixel region and a non-pixel region, a buffer layer disposed on the substrate, a semiconductor layer disposed on the buffer layer, and including a channel region and source/drain regions, a gate electrode disposed to correspond to the channel region of the semiconductor layer, a gate insulating layer insulating the semiconductor layer from the gate electrode, source/drain electrodes electrically connected to the source/drain regions of the semiconductor layer, and an interlayer insulating layer insulating the gate electrode from the source/drain electrodes, wherein areas of the buffer layer, the gate insulating layer and the interlayer insulating layer that are on the non-pixel region, respectively, are removed, and the partially removed area is 8% to 40% of a panel area.

6 Claims, 3 Drawing Sheets

(56) References Cited

FOREIGN PATENT DOCUMENTS

| | | |
|---|---|---|
| JP | 2003-149677 | 5/2003 |
| JP | 2006-156369 | 6/2006 |
| JP | 2008-166703 | 7/2008 |
| KR | 2003-0060403 | 7/2003 |
| KR | 10-2006-0067049 | 6/2006 |
| KR | 10-2009-0131922 | 12/2009 |
| WO | 2006021568 | 3/2006 |

\* cited by examiner

ORGANIC LIGHT EMISSION DIODE DISPLAY DEVICE AND METHOD OF FABRICATING THE SAME

CROSS-REFERENCE TO RELATED APPLICATION

This application claims priority to and the benefit of Korean Patent Application No. 10-2008-0129326, filed on Dec. 18, 2008, the disclosure of which is incorporated herein by reference in its entirety.

BACKGROUND OF THE INVENTION

1. Field of the Invention

An aspect of the present invention relates to an organic light emission diode (OLED) display device and a method of fabricating the same, in which an insulating layer of a non-pixel region is removed to prevent a substrate from being bent or deformed due to an annealing process performed at a high temperature during a crystallization process.

2. Description of the Related Art

In general, polycrystalline silicon is applicable to high field effect mobility and a high operating circuit, and can constitute a CMOS circuit, and thus is widely used for a semiconductor layer of a thin film transistor. The thin film transistor using a polycrystalline silicon layer is generally used as an active element of an Active Matrix Liquid Crystal Display (AM-LCD), and a switching element and a driving element of an organic light emitting diode (OLED).

A method of fabricating a polycrystalline silicon layer used for a thin film transistor includes a direct-deposition method, a technique using high-temperature heat treatment and a laser heat treatment method. While the laser heat treatment method enables a low temperature process and a high field effect mobility to be implemented, the laser heat treatment requires a high-price laser device and thus research into techniques capable of replacing the conventional techniques is underway.

Currently, methods of crystallizing polycrystalline silicon using metals are being extensively researched since crystallization can be performed at a lower temperature than that of solid phase crystallization (SPC) within a shorter time period. The methods of crystallizing polycrystalline silicon using metals are classified as a metal induced crystallization (MIC) method and a metal induced lateral crystallization (MILC) method. However, the methods using metals may deteriorate device characteristics of a thin film transistor due to metal contamination.

In the meantime, in order to reduce an amount of metals and to form a high-quality polycrystalline silicon layer, a method in which a metal ion concentration is adjusted by an ion implanter, such that a high-quality polycrystalline silicon layer is formed by a high-temperature heat treatment, a rapid heat treatment or irradiation with a laser is developed. Also, another method has been developed in which, in order to planarize a surface of a polycrystalline silicon layer using the MIC method, a viscous organic layer is mixed with a liquefied metal to deposit a thin film using a spin coating method, and then an annealing process is performed to crystallize. However, in such crystallization methods, problems in terms of large-scale and uniform grains that are the most important issue of the polycrystalline silicon layer are exhibited.

In order to overcome such problems, a method of fabricating a polycrystalline silicon layer through a crystallization method using a capping layer (Korean Patent Publication No. 2003-0060403) has been developed. The method is a super grained silicon (SGS) method in which a polycrystalline silicon layer is formed on a substrate, a capping layer is formed thereon, a metal catalyst layer is deposited on the capping layer, and the metal catalyst is diffused to the polycrystalline silicon layer through the capping layer by means of an annealing process or laser to form a seed, so that a polycrystalline silicon layer is obtained. In the crystallization method, since the metal catalysts are diffused through the capping layer, unnecessary metal contamination can be prevented.

However, forming a polycrystalline silicon layer using the MIC method, the MILC method, or the SGS method requires an annealing process performed at a high temperature, and this may cause an insulating layer formed of the same size as a substrate to shrink, and the substrate may be bent. Furthermore, the shrinking of the insulating layer may cause a device to fail.

SUMMARY OF THE INVENTION

An aspect of the present invention provides an organic light emission diode (OLED) display device and a method of fabricating the same in which an insulating layer of a non-pixel region is selectively removed, so that a substrate is prevented from being bent due to an annealing process for crystallization thus preventing damage to the substrate when manufacturing the device.

According to another aspect of the present invention, an OLED display device includes: a substrate including a pixel region and a non-pixel region; a buffer layer disposed on the substrate; a semiconductor layer disposed on the buffer layer, and including a channel region and source/drain regions; a gate electrode disposed to correspond to the channel region of the semiconductor layer; a gate insulating layer insulating the semiconductor layer from the gate electrode; source/drain electrodes electrically connected to the source/drain regions of the semiconductor layer; and an interlayer insulating layer insulating the gate electrode from the source/drain electrodes, wherein a part of the buffer layer, the gate insulating layer or the interlayer insulating layer which is on the non-pixel region is removed, and the partially removed area is 8% to 40% of a panel area of the OLED display.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

Figure 1A:
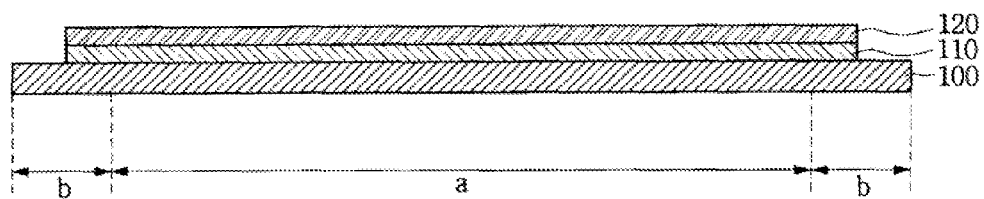
FIGS. 1A to 1E illustrate an organic light emitting diode (OLED) according to an aspect of the present invention.

Table 1-1 represents data in which a height of a bent substrate is measured according to an aspect of the present invention; and Table 1-2 represents data in which a radius vs. bending of a substrate is measured according to an aspect of the present invention.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the embodiments of the present invention by referring to the figures.

Example

Figure 1B:
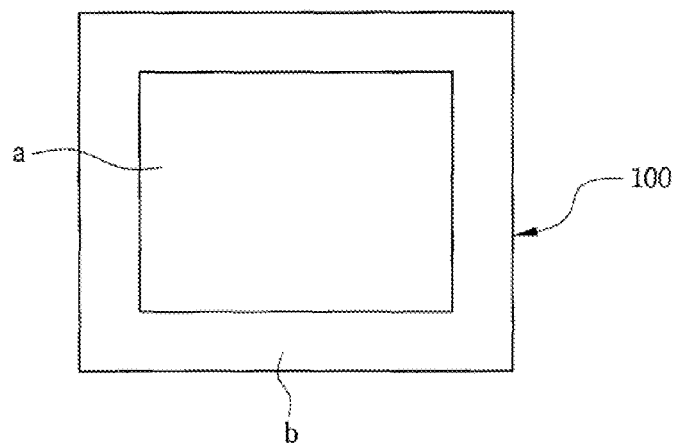
Figure 1C:
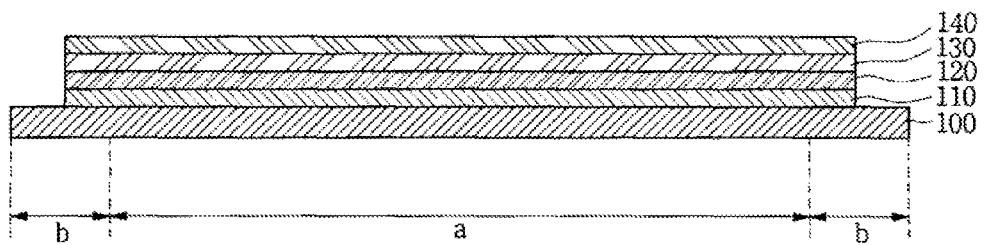
Figure 1D:
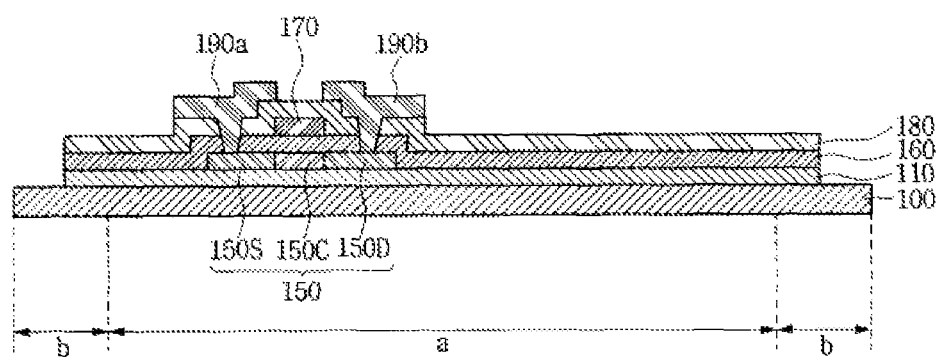

FIGS. 1A, 1C, and 1D are cross-sectional views of an organic light emitting diode (OLED) display device according to an aspect of the present invention, and FIG. 1B is a plan view of a pixel according to an aspect of the present invention. Hereinafter, it is to be understood that where stated that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Referring to FIG. 1A, a substrate 100 including a pixel region a and a non-pixel region b is formed, and a buffer layer 110 is formed on the substrate 100. The substrate 100 may be an insulating substrate formed of glass, and the buffer layer 110 functions to protect a semiconductor layer from impurities that come out from the substrate 100. The buffer layer 110 may be formed of $SiO_2$, $SiN_x$ or a compound thereof.

An amorphous silicon layer 120 is formed on the entire surface of the substrate where the buffer layer 110 is formed. The amorphous silicon layer 120 may be formed by performing a chemical vapor deposition (CVD) method.

Afterwards, parts of the amorphous silicon layer 120 and the buffer layer 110 that correspond to the non-pixel region b are removed. This is because high-temperature heat is applied during the crystallization of the amorphous silicon layer 120, and the buffer layer 110 having the same area as the substrate 100 and directly bonded thereto is shrunk, and pulls the substrate 100 causing the substrate 100 to be bent. Therefore, even though the buffer layer 110 is shrunk when edges of the buffer layer 110 are removed, a problem of pulling the substrate 100 may be overcome to some extent. As a result, a degree of bending of the substrate may be lowered.

Referring to FIG. 1B, the area of the buffer layer to be removed is defined within an area that meets the requirements ranging from an outermost edge of the non-pixel region b, which is outside of the pixel region, to an outer edge of the pixel region a, and the area of the buffer layer to be removed is 8% to 40% of a panel area. This is because when the area of the removed buffer layer on the non-pixel region b is less than 8%, the removed amount of the layer is so small that, although the buffer layer on the non-pixel region b is removed, the buffer layer still has an effect on the substrate, so that the substrate is still bent. Further, in order for an insulating layer to operate as a device, its area with respect to a panel should be at least 60%. Therefore, it is advantageous to remove an area of the insulating layer with respect to the panel area by 40% or less. When an area of the insulating layer with respect to the panel area is removed by 40% or more, the buffer layer on the pixel region may be partially removed, and this may cause infiltration of impurities or the like.

Next, referring to FIG. 1C, after the amorphous silicon layer 120 is formed as described above, the capping layer 130 is formed on the amorphous silicon layer 120. The capping layer 130 may be formed of a silicon nitride layer or a silicon oxide layer, and may be formed using a plasma enhanced chemical vapor deposition (PECVD) method.

The capping layer 130 is formed to enable diffusion of a metal catalyst, to be described below, and may be formed to a thickness of 5 Å to 2000 Å. When the thickness of the capping layer is 5 Å or smaller, it is difficult to control a low concentration of a metal catalyst, and when the thickness is 2000 Å or greater, it is difficult to diffuse the metal catalyst, and thus the capping layer may be formed to such a thickness. Also, in general, an oxide or nitride layer functions as a barrier in the diffusion of impurities, and thus density of the silicon oxide or silicon nitride layer may be lowered to facilitate the diffusion of the metal catalyst.

Subsequently, the metal catalyst layer 140 is formed on the capping layer 130. The metal catalyst layer 140 may be formed of nickel, and may be deposited by sputtering. Furthermore, the metal catalyst layer may be formed using an ion implantation method or using plasma. The method using plasma includes disposing metallic materials on the capping layer 130, and exposing the results to plasma, so that the metal catalyst layer is formed.

The metal catalyst layer 140 formed by such methods may be formed to a thickness of 2 Å or smaller. When the metal catalyst is deposited sporadically rather than densely in order to control low concentrations of the metal catalyst, a concentration of the metal catalyst increases when the thickness of the formed metal catalyst layer 140 is 2 Å or greater, so that it is difficult to control a low-concentration. Further, a concentration of the metal catalyst in silicon increases as well, and thus leakage current of a transistor increases, and the grain size of a polycrystalline silicon layer, to be described below, is reduced.

Afterwards, an annealing process is performed on the substrate 100 at a temperature of 750° C. or lower for several seconds to several hours using a heating device such as a furnace, rapid thermal annealing (RTA), etc.

As a result of the annealing process, the metal catalyst of the metal catalyst layer 140 is diffused into the amorphous silicon layer 120, and the annealing process is continuously performed, so that the amorphous silicon layer 120 is crystallized into a polycrystalline silicon layer.

Next, referring to FIG. 1D, the capping layer 130 and the metal catalyst layer 140 are etched and removed, so that unnecessary metal contamination of the crystallized polycrystalline silicon layer may be prevented. The polycrystalline silicon layer is patterned, and source/drain regions 150S and 150D and a channel layer 150C are formed through an ion implantation process. That is, a semiconductor layer 150 is formed.

After a gate insulating layer 160 is formed on the semiconductor layer 150, a gate electrode 170 is formed on the gate insulating layer 160. Then, an interlayer insulating layer 180 is formed on the gate electrode 170.

Like the buffer layer 110, the gate insulating layer 160 and the interlayer insulating layer 180 may be formed of $SiO_2$, $SiN_X$ or a compound thereof, and parts of the layers on the non-pixel region b, respectively, are removed.

Subsequently, source/drain electrodes 190a and 190b partially connected to the semiconductor layer 150 are formed.

As described above, a thin film transistor in which parts of the buffer layer 110, the gate insulating layer 160 and the interlayer insulating layer 180 that are on the non-pixel region b, respectively, on the substrate 100 are removed is completed.

Figure 1E:
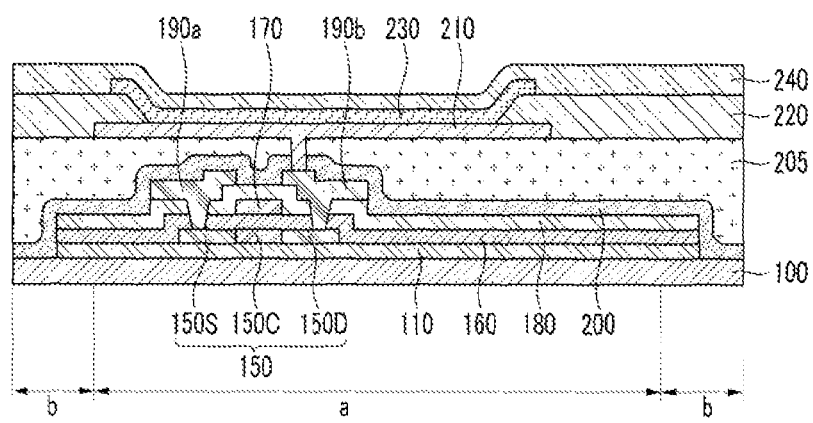

Next, referring to FIG. 1E, after forming the thin film transistor, a protection layer 200 is formed on the entire surface of the substrate including the source/drain electrodes 190a and 190b. Afterwards, a planarization layer 205 and a first electrode 210 are formed on the protection layer 200.

Subsequently, pixels are defined by a pixel definition layer 220, and then an organic layer 230 including an organic light emission layer is formed. Afterwards, a second electrode 240 is formed on the entire surface of the substrate to complete an OLED display device including the thin film device.

Meanwhile, a state of the substrate when the process of removing parts of the buffer layer 110, the gate insulating layer 160 and the interlayer insulating layer 180 that are on the non-pixel region b, respectively, is performed and is not performed according to an example embodiment of the present invention will be described with reference to the following Tables 1-1 and 1-2.

In the following Tables 1-1 and 1-2, data as a result of measuring a substrate state after forming a polycrystalline silicon layer according to an example embodiment is shown. Table 1-1 represents data as a result of measuring a height of a bent substrate before and after performing an annealing process according to an example embodiment of the present invention (A: before performing the annealing process, and B: after performing the annealing process) and according to a case when an insulating layer is not removed. In addition, Table 1-2 represents data as a result of measuring a radius of a bent substrate before and after performing an annealing process according to an example embodiment of the present invention (A: before performing the annealing process, and B: after performing the annealing process) and according to a case when an insulating layer is not removed.

TABLE 1-1

| | A Height (μm) | B Height (μm) | Height (μm) Deviation |
|---|---|---|---|
| Example Embodiment | 172.8 | 567.73 | 394.93 |
| When an insulating layer is not removed. | 129.89 | 675.11 | 545.22 |

Referring to Table 1-1, in the substrate having a mother substrate of 730×920 mm from which 10% of an insulating layer is removed according to an example embodiment of the present invention, the height of the substrate before the annealing process (A) is 172.8 μm and the height after the annealing process (B) is 567.73 μm, and thus a height deviation thereof is 394.93 μm. In the meantime, when the insulating layer is not removed, the height deviation between the height before the annealing process (A) of 129.89 μm and that after the annealing process (B) of 675.11 μm is 545.22 μm. Therefore, it is observed that the height of the substrate after the annealing process according to the example embodiment of the present invention is less bent. It is also apparent that when the insulating layer formed on a non-pixel region is removed after the annealing process (B), the substrate is less bent.

TABLE 1-2

| | A Radius (m) | B Radius (m) | Radius (m) Deviation |
|---|---|---|---|
| Example Embodiment | 99.03 | 30.14 | 68.69 |
| When an insulating layer is not removed. | 131.74 | 25.35 | 106.39 |

Subsequently, referring to Table 1-2, when a substrate is bent, a degree of bending is regarded as the circumference of a circle, and the radius of the circle is measured. Accordingly, the smaller the radius of deviation, the smaller a degree of bending.

In Table 1-2, according to the example embodiment of the present invention, when 10% of the insulating layer is removed from the mother substrate of 730×920 mm, the radius before the annealing process (A) is 99.03 m, and after the annealing process (B), the radius becomes 30.14 m, so that the radius is reduced by 68.69 m. In the meantime, when the insulating layer is not removed, the radius before the annealing process (A) is 131.74 m, and after the annealing process (B), the radius is 25.35 m, so that the radius was reduced by 106.39 m. As shown in the results, in the example embodiment of the present invention, a radius deviation of 68.69 m is observed, while in the case when the insulating layer is not removed a radius deviation of 106.39 m is observed, and thus the radius deviation according to the aspects of the present invention is reduced Therefore, it is shown that a degree of bending of the substrate according to the example embodiment of the present invention is less than that of the substrate in which the insulating layer has not been removed.

The method applied to the OLED display device may be applied to a mother substrate. The mother substrate 10 includes a plurality of pixels 20, and refers to a substrate before being chamfered.

Figure 2:
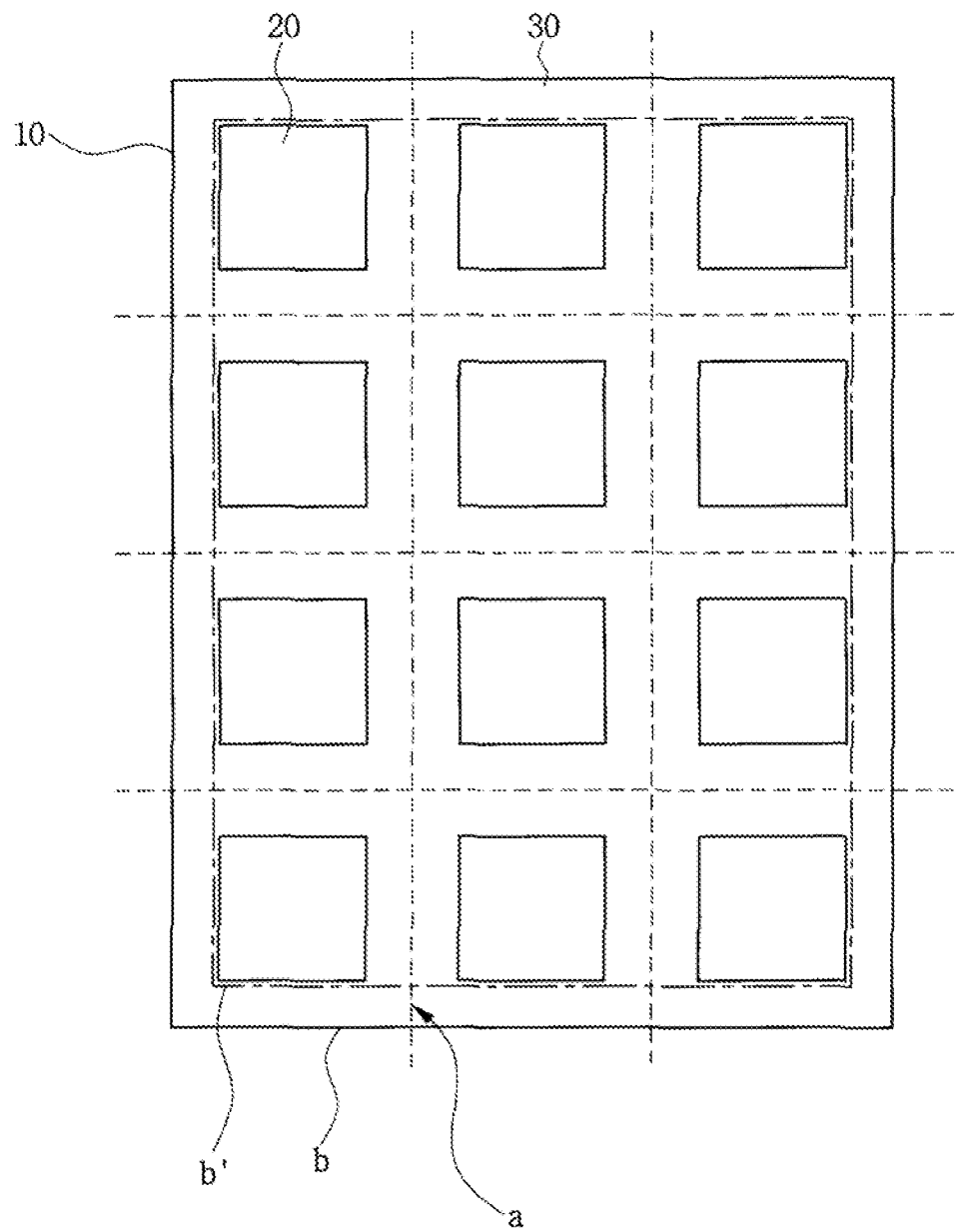
FIG. 2 is a plan view of a mother substrate according to an aspect of the present invention.

FIG. 2 is a plan view of a mother substrate according to an aspect of the present invention.

Referring to FIG. 2, a plurality of pixels 20 are formed on the mother substrate 10. At this time, the plurality of pixels 20 are disposed to be spaced apart from each other, and a scribing line a to be chamfered after completion of a device exists between the pixels.

An OLED display device including a thin film transistor consisting of a gate electrode (not shown), a semiconductor layer (not shown), source/drain electrodes (not shown), etc., is formed in the pixel 20, and an insulating layer 30 is formed in a non-pixel region that is an outer region of the pixel 20. At this time, an annealing process including a crystallization process, etc., is carried out, and after a part of the insulating layer 30 in the outer region of the pixels 20 is removed from the mother substrate 10, the annealing process is carried out.

An area of the insulating layer 30 that is removed from the mother substrate 10 is defined within an area that meets the requirements ranging from an outermost edge b of the mother substrate 10 to an outermost edge b' of the pixel, which is defined along outermost pixels 20. The insulating layer 30 between the plurality of pixels 20 may be removed, and an area of the insulating layer 30 to be removed corresponds to 8% to 40% of the total area of the mother substrate 10. The insulating layer 30 of the mother substrate 10 may be formed of a silicon oxide layer, a silicon nitride layer or a combination thereof.

The reason that the area of the insulating layer 30 to be removed should be 8% to 40% of the area of the mother substrate 10 is provided below. When the area of the insulating layer 30 removed from the mother substrate 10 is less than 8% of the mother substrate 10, the removed amount is so small that the shrink of the insulating layer 30 caused by an annealing process has an effect on the substrate, and the substrate is still bent regardless of the removal of the insulating layer 30. Moreover, for example, in the process of forming a plurality of 2-inch, 4-inch or 15-inch panels on the mother substrate 10 having a size of 730×920 mm, it is observed that 35% of an insulating layer is removed in the case of 2-inch panels, 40% is removed in the case of 4-inch panels, and 35% is removed in the case of 15-inch pixels panels. If the insulating layer is removed in much larger percentages than the above percentages, impurities may infiltrate, and insulating characteristics may not be ensured, so that a maximum area of the insulating layer to be removed may be 40% or lower.

Therefore, the above-described aspects of the present invention provide an OLED display device, a method of fabricating the same and a mother substrate in which a part of the insulating layer is removed, so that bending of a substrate caused by an annealing process performed at a high-temperature when an OLED display device is manufactured can be alleviated, and failures can be reduced.

While crystallization using a SGS method is mainly described in the aspects of the present invention, MIC and MILC in which crystallization is performed using metal catalysts can be applied.

In the aspects of the present invention, in order to prevent a substrate from being bent due to an annealing process performed at a high temperature in the process of crystallization using a metal catalyst carried out to produce an excellent device, a structure in which insulating layers of a substrate are partially removed is formed. Therefore, although the annealing process performed at a high temperature causes the insulating layers to shrink, the substrate may be less bent. Furthermore, failures may be prevented in the process of forming a device.

Although the aspects of the present invention have been described with reference to certain exemplary embodiments thereof, it will be understood by those skilled in the art that a variety of modifications and variations may be made to the aspects of the present invention without departing from the spirit or scope of the aspects of the present invention defined in the appended claims, and their equivalents.

What is claimed is:

1. An organic light emission diode (OLED) display device, comprising:
   a substrate comprising a pixel region and a non-pixel region;
   a buffer layer disposed on the substrate;
   a semiconductor layer disposed on the buffer layer, and comprising a channel region, and source and drain regions;
   a gate electrode disposed to correspond to the channel region of the semiconductor layer;
   a gate insulating layer disposed between the semiconductor layer and the gate electrode;
   source and drain electrodes electrically connected to the source and drain regions, respectively, of the semiconductor layer;
   an interlayer insulating layer disposed between the gate electrode and the source and drain electrodes; and
   a first electrode, an organic layer, and a second electrode that are electrically connected to one of the source and drain electrodes,
   wherein an area of the buffer layer, the gate insulating layer, and the interlayer insulating layer is partially removed from the non-pixel region, and the area that is partially removed corresponds to 8% to 40% of a total area of the substrate.

2. The OLED display device of claim 1, wherein the area that is partially removed is within an area ranging from an outer edge of the non-pixel region towards an outer edge of the pixel region.

3. The OLED display device of claim 1, wherein the semiconductor layer comprises metal particles.

4. The OLED display device of claim 1, wherein the buffer layer, the gate insulating layer, and the interlayer insulating layer comprise silicon dioxide ($SiO_2$), silicon nitride ($SiN_x$), or a compound of the $SiO_2$ or the $SiN_X$.

5. The OLED display device of claim 1, wherein the buffer layer, the gate insulating layer, or the interlayer insulating layer comprises a silicon oxide ($SiO_2$) layer or a silicon nitride (SiNx) layer.

6. The OLED display device of claim 1, wherein the area of the buffer layer, the gate insulating layer, and the interlayer insulating layer is removed, at least partially, from the non-pixel region such that no portion of the buffer layer, the gate insulating layer, and the interlayer insulating layer remains in the removed area of the non-pixel region.

* * * * *